United States Patent [19]

Fanning

[11] Patent Number: 4,541,034
[45] Date of Patent: Sep. 10, 1985

[54] ELECTRICAL TERMINAL AND METHOD OF SECURING SAME IN CIRCUIT SUBSTRATE THRU-HOLE

[75] Inventor: William J. Fanning, Glen Ellyn, Ill.

[73] Assignee: AT&T Technologies, Inc., New York, N.Y.

[21] Appl. No.: 604,297

[22] Filed: Apr. 26, 1984

[51] Int. Cl.³ .......................... H01R 9/00; H05K 1/00
[52] U.S. Cl. .................................. 361/405; 174/68.5; 339/17 C
[58] Field of Search .............. 339/17 C; 361/306, 308, 361/405; 174/68.5

[56] References Cited

U.S. PATENT DOCUMENTS

| | | | |
|---|---|---|---|
| 2,683,259 | 7/1954 | Lowther | 339/193 |
| 2,754,486 | 7/1956 | Hathorn | 339/17 C |
| 3,152,388 | 10/1964 | Grossman | 339/17 C X |
| 3,236,936 | 2/1966 | Robinson | 361/308 X |
| 3,345,622 | 10/1967 | Matsushita | 174/68.5 X |
| 3,610,811 | 10/1971 | O'Keefe | 339/17 C X |
| 3,780,433 | 12/1973 | Lynch | 339/17 C X |
| 3,846,741 | 11/1974 | Kunkle et al. | 339/221 R |
| 3,925,596 | 12/1975 | Siden | 174/68.5 |

Primary Examiner—Donald A. Griffin
Attorney, Agent, or Firm—K. R. Bergum; M. de Picciotto

[57] ABSTRACT

A thru-hole insertable terminal (10, 50, 60) includes an upper shank portion (12, 52, 66) preferably adapted for soldered securement to an end electrode (24) of a component (20), such as a capacitor. A lower shank portion (14, 54, 68) is dimensioned and adapted for minimal initial contact insertion into, and the temporary securement thereafter within, an oversized thru-hole (26, 58, 62) of a supporting substrate, such as a circuit board (28, 59, 64). At least one upwardly extending free-ended tab (32, 56, 72, 74) is formed in the lower terminal shank portion (14, 54, 68), and is oriented in the major plane thereof until after the insertion thereof within an associated substrate-formed thru-hole (26, 58, 62). Stop means (14b, 14c, 54b, 54c, 68b, 68c) also formed in the lower terminal shank portion is adapted to position the upper free end of the tab at an elevation preferably below the upper open end of a confining thru-hole. The tab (32, 56, 72, 74) is also dimensioned such that, when thusly positioned, the lower integral end thereof extends at least to the lower open end of the thru-hole. This results in the upper free end of the tab being pivoted against the sidewall of the confining thru-hole in response to a then downwardly protruding end region (14d, 54d, 68d) of the lower terminal shank portion being clinched against the underside of the supporting substrate (28, 59, 64). The thusly pivoted tab advantageously not only facilitates the temporary securement of the terminal within the associated thru-hole, but the establishment thereafter of a reliable, permanent soldered connection therebetween.

20 Claims, 10 Drawing Figures

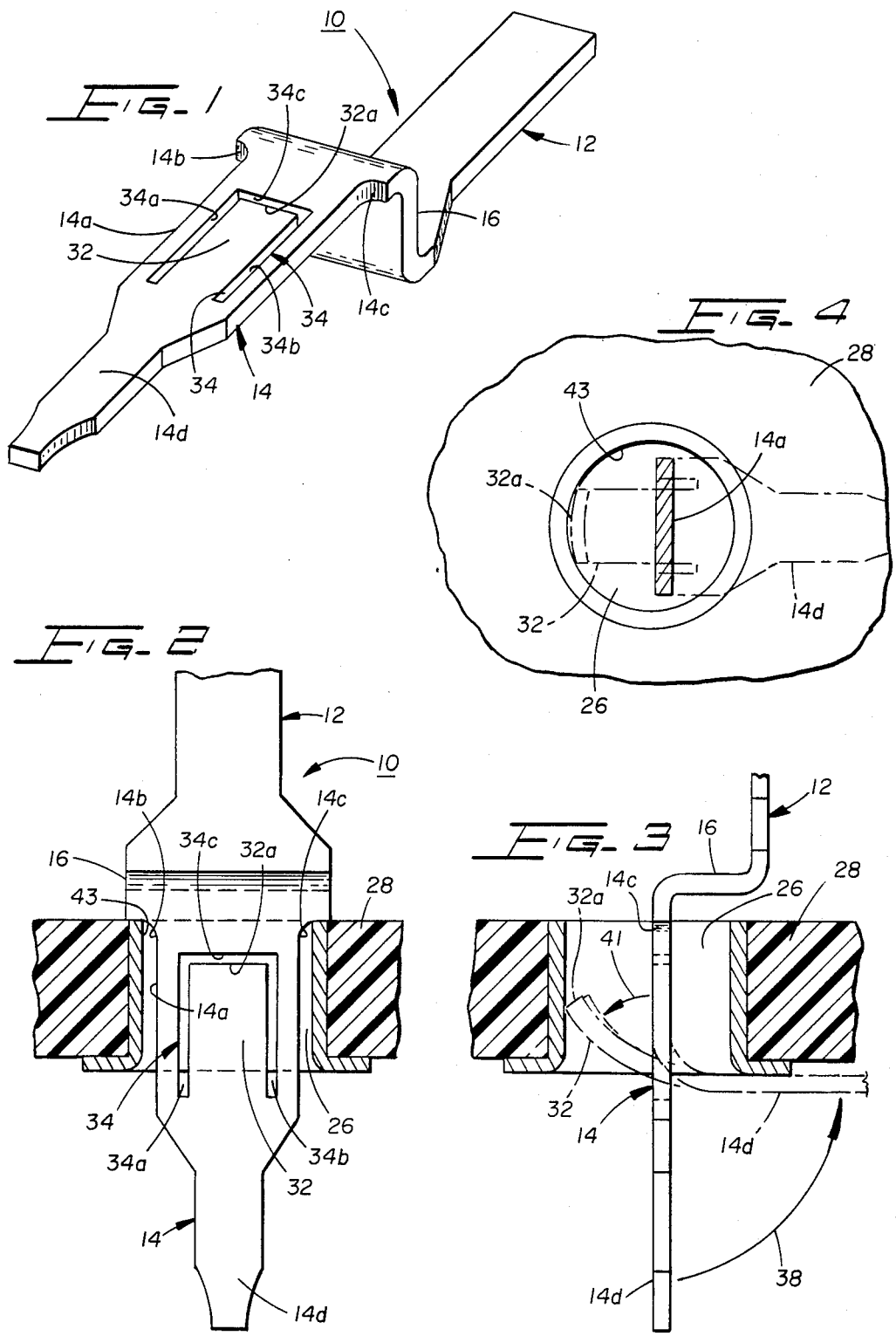

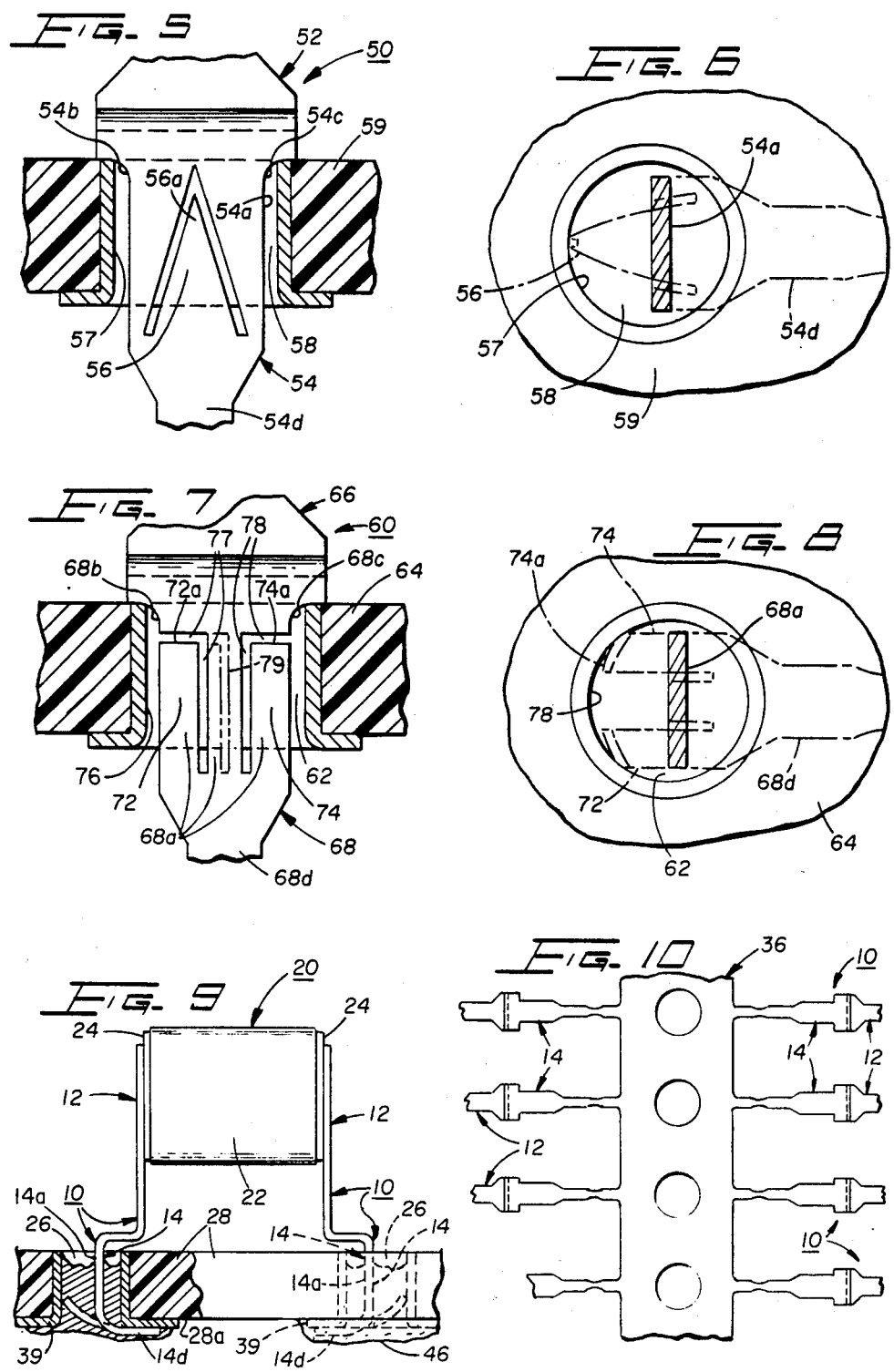

ELECTRICAL TERMINAL AND METHOD OF SECURING SAME IN CIRCUIT SUBSTRATE THRU-HOLE

FIELD OF THE INVENTION

This invention relates to electrical terminals and, more particularly, to such a terminal of the type having an insertion section adapted to facilitate both the temporary and permanent securement thereof, in accordance with a related method of assembly, in a thru-hole of a circuit-supporting substrate.

BACKGROUND OF THE INVENTION

In the assembly of high density circuit boards, as well as other types of circuit-supporting substrate assemblages, various types of electrical components are often mounted on, and temporarily secured to, a circuit board, for example, before being soldered thereto through the use of thru-hole insertion-type terminals. As used herein, an electrical component is also understood to embrace any type of terminal-connected electrical device, such as a miniaturized relay. Similarly, all references to a circuit board hereinafter are understood to embrace a circuit-supporting substrate of any type, such as of ceramic material, which may form part of a circuit pack, for example.

It is often desirable that component insertable terminals be constructed and dimensioned such that force-fit, frictional contact is not established with thinly plated thru-hole sidewalls, for example. Any biting, or abrasive terminal-sidewall contact can often readily seriously damage, if not destroy, the conductive integrity of a given plated thru-hole.

Accordingly, when force-fit terminal insertion has not been desired heretofore, clinching of the ends of intentionally loosely inserted component terminals against the underside of a circuit board, for example, has normally been relied upon to provide temporary securement of board-mounted components prior to permanent soldered connections being established therebetween. It should be appreciated, however, that even clinched component terminals, particularly when the clinched ends are relatively short (as often dictated by circuit board space requirements), can often become dislodged from oversized thru-holes. This temporary securement problem is compounded whenever the terminal-secured components (or devices) have an appreciable mass, and/or a relatively high circuit board-mounted profile.

In addition, the prior use of conventional terminals of the so-called zero-insertion force type, in oversized thru-holes, has also often led to soldering defects. More specifically, when there is no terminal-thru-hole sidewall contact, generally referred to as a "bull's-eye", molten solder is often not satisfactorily drawn upwardly into the lower end of such a terminal-confining thru-hole by capillary attraction. When that happens, the resulting soldered connection may often prove to be defective either immediately, or after variable periods of use in the field. Unfortunately, such defective soldered connections many times are not readily detectable by visual inspection, even when magnified viewing is employed for that purpose.

Notwithstanding the problems encountered heretofore in using terminals formed with relatively smooth outer surfaces and undersized insertion sections (relative to a given sized thru-hole), so as to minimize otherwise possible damage to thinly plated thru-hole sidewalls, such terminals are normally considerably less expensive and easier to manufacture. Further, compared to terminals formed with barbed or sawtoothed edges, for example, terminals constructed for loose-fitting insertion are much easier to handle and manipulate during not only their fabrication, but subsequent securement to respectively associated electrodes of a component. Such terminals further significantly facilitate the magazine feeding, and subsequent insertion thereof in respectively aligned thru-holes of a circuit board, for example, particularly when automated equipment is employed for such processing operations.

Accordingly, there has been a definite need for a component terminal that is constructed in a manner that would not only facilitate the fabricating, electrode attaching, feeding and inserting operations relating thereto in a reliable and automated manner, but also facilitate the subsequent temporary securement thereof within an oversized thru-hole, as well as the attainment thereafter of a reliable permanent soldered connection therebetween.

SUMMARY OF THE INVENTION

In accordance with one preferred insertion type terminal embodiment, an upper shank portion thereof is particularly adapted for attachment to an electrode of a component, whereas a lower shank portion is particularly adapted for minimal initial contact insertion into, and the temporary securement thereafter within, an oversized thru-hole of a supporting substrate, such as a circuit board. The lower terminal shank portion, dimensioned to have a width less than the diameter of the thru-hole into which it is to be inserted, includes an insertion section uniquely formed with at least one upwardly extending, and initially in-plane oriented, free-ended tab. The lowermost end of the tab is integral with a remaining end region of the lower shank portion that is adapted to be ultimately clinched against the underside of the circuit board.

Depth-controlling stops are formed in the lower terminal shank portion to position the upper free end of the initially in-plane oriented tab at an elevation preferably at least slightly below the upper end of a confining thru-hole. The thusly positioned tab is also dimensioned such that the lower integral end thereof is located so that a plane defined by the lower surface of the supporting substrate will pass through the tab at a point that is preferably near or at the lower end thereof. As such, when the downwardly protruding end region of the lower terminal shank portion is firmly bent in a given direction, perpendicular to the major plane thereof, against the underside of a supporting substrate, the thru-hole confined portion of the tab is significantly pivoted in an opposite direction. This causes the upper free-end of the tab to contact, and if desired, slightly bite into, the inner sidewall of the thru-hole and, thereby, facilitate the temporary locking of the terminal therewithin prior to establishing a permanent soldered connection therebetween.

Such pivoted tab-sidewall contact not only minimizes possible damage to the latter during terminal insertion, but concomitantly has been found to enhance the capillary attraction of solder into the lower end of the terminal-confining thru-hole, such as during a conventional wave soldering operation. This beneficial result is realized even when a given terminal is inserted within an oversized thru-hole such that it ultimately makes no other contact than through the tab with the sidewall thereof. As previously mentioned, a terminal positioned so as to be axially centered in a thru-hole is generally referred to as a "bull's-eye", and has often resulted in defective terminal-thru-hole soldered connections. This problem has proven particularly troublesome heretofore in connection with components and/or devices having dual-in-line arrays of terminals that are simultaneously inserted into respectively aligned substrate-formed thru-holes, and when only selected outer end terminals are thereafter clinched against the substrate during a circuit assembly operation.

The use of one or more peculiarly located and pivotal tabs advantageously also allows the lowermost end region of the terminal that is normally clinched against the underside of an associated circuit board, for example, to be very short. This is not only desirable, but often required, in connection with the assembly of high density circuitry on a circuit board (or any other substrate) where surface space is at a premium.

Another advantage resulting from the use of one or more pivotable tabs, as employed in the terminals embodied herein, is that the latter, depending in part on the dimensions thereof, and type of material out of which it is made, may be subsequently retracted from a given thru-hole (such as for repair or replacement) much more readily, and with far less possible damage to any thru-hole plated sidewall, than is the case when a terminal is dimensioned to be force-fit inserted in a given thru-hole. This is particularly true when a force-fit type terminal includes a compliant section having sharp edges or saw-toothed barbs that are specifically intended to forcefully and permanently bite into a plated thru-hole sidewall.

With the terminals embodied herein also preferably being initially formed out of strip-stock, and with at least the one partially blanked out tab formed therein remaining in the major plane of the lower shank portion until the latter is inserted into a given thru-hole, there are no sharp outwardly extending terminal projections, or serrated edges, to impede or complicate not only the fabrication, but electrode attachment, feeding and insertion operations associated therewith, particularly in an automated manner.

BRIEF DESCRIPTION OF THE DRAWINGS

FIG. 1 is an enlarged, perspective view of one preferred terminal of the thru-hole insertion type embodying the principles of the present invention;

FIG. 2 is an enlarged, fragmentary detail view, partially in section, showing one major side of the terminal of FIG. 1 after having been inserted to the proper depth within a plated thru-hole of a supporting substrate, such as a circuit board;

FIG. 3 is an enlarged, fragmentary detail view, partially in section, showing one edge of the terminal of FIG. 2, partially in phantom, after a clinching operation which simultaneously results in the upper free end of the tab formed therein being pivoted into contact with the plated sidewall of the thru-hole, in accordance with the principles of one preferred method of the present invention;

FIG. 4 is an enlarged, fragmentary detail plan view, partially in section and phantom, showing the terminal of FIG. 3 after the lower end thereof has been clinched, and the tab thereof pivoted against the associated thru-hole sidewall;

FIG. 5 is an enlarged, fragmentary detail view, partially in section, of a second preferred terminal embodiment, as confined within a substrate-formed thru-hole, and incorporating a pivotal tab of inverted V-shaped configuration, in accordance with the present invention;

FIG. 6 is an enlarged, fragmentary detail plan view, partially in section and phantom, showing the terminal of FIG. 5 after the lower end thereof has been clinched, and the tab thereof pivoted against the associated thru-hole sidewall;

FIG. 7 is an enlarged, fragmentary detail view, partially in section, of still another preferred terminal embodiment, as confined within a substrate formed thru-hole, and incorporating two opposite side free-ended and pivotal tabs, in accordance with the present invention;

FIG. 8 is an enlarged, fragmentary detail plan view, partially in section and phantom, showing the terminal of FIG. 7 after the lower end thereof has been clinched, and the tab thereof pivoted against the associated thru-hole sidewall;

FIG. 9 is a side elevational view of an illustrative capacitor having a pair of terminals of the type depicted in FIG. 1, after the terminals have been inserted in respectively aligned thru-holes of a supporting substrate, clinched to pivot the tabs, and soldered; and FIG. 10 is an enlarged, fragmentary plan view of a metal strip stock carrier out of which the terminals in the first, as well as in the other related embodiments described herein, may be readily blanked and formed.

DETAILED DESCRIPTION

It should be appreciated that while the invention is described in detail herein primarily in regard to thru-hole insertion-type terminals adapted for soldered securement to, and forming part of, a component in the form of a metallized film wound capacitor, all of the illustrative terminal embodiments are equally applicable for use with other diverse types of components and devices. Concomitantly, the terminals embodied herein may also be employed in effecting circuit interconnections with discrete conductors or connectors, while thru-hole mounted in many different types of supporting substrates, in addition to circuit boards, as selectively employed in various types of complex electronic systems and equipment.

With particular reference first to FIGS. 1-4 and 9, there is illustrated a thru-hole insertion type terminal 10 embodying the principles of the present invention. The terminal is preferably formed out of thin, ductile strip-stock material with an upper shank portion 12 and a lower thru-hole insertion shank portion 14, both of rectangular cross-section, as illustrated. It is understood, of course, that the upper terminal shank portion, in particular, may be formed with any other desired cross-section so as to facilitate any particular type of soldered or solderless electrical connection being made thereto, such as a wire wrap connection.

One preferred strip-stock material for forming the terminals embodied herein is sold under the trade name Olin Brass 194, and is commercially available from the Olin Brass Corporation. It is understood, of course, that many other commercially available strip-stock materials, such as phosphor-bronze, produced in various thicknesses, may also be employed to form terminals of the type embodied herein.

The upper shank portion 12, as illustrated, is offset from the lower shank portion 14 by a laterally disposed, interconnecting leg portion 16. Such an offset allows flexibility in establishing any desired spacing between a given pair of terminals, such as when they form part of an electrical component 20 (see FIG. 9) which, for purposes of illustration, comprises a capacitor of the metallized, film-wound type. The shoulder-defining leg portions 16 of such component terminals, if desired, could also be employed to facilitate terminal engagement by insertion-type drive members (not shown) of an automatic component insertion machine, for example.

As illustrated in FIG. 9, the capacitor includes a main body portion (or blank) 22, typically fabricated with two heat fusible end electrodes 24, in the form of solder blocks. An upper shank portion region of each of a pair of the thru-hole insertable terminals 10, embodying the principles of the present invention, is shown solder-secured to an associated one of the capacitor end electrodes. An insertion section 14a of the lower shank portion 14 of each terminal is shown inserted within an associated thru-hole 26 of an illustrative circuit board 28. As will be described in greater detail hereinbelow, a terminal soldering operation follows a multi-purpose terminal clinching operation in accordance with one preferred method embodied herein.

In the assembly of the capacitor 20, the main body portion (or blank) 22 thereof is often encapsulated within a molded housing (not shown) after the terminals 10 have been solder-secured to the electrodes 24 thereof. One preferred form of the capacitor blank per se with which the terminals 10 may be readily employed is disclosed in U.S. Pat. No. 4,241,127, of W. J. Fanning, assigned to the Western Electric Company, Inc., and incorporated herein by reference. One alternative configuration of the upper terminal shank portion 12, and method for effecting the soldered securement thereof to a capacitor (or any other component) electrode of the solder block type, is disclosed in W. J. Fanning application Ser. No. 562,780, filed Dec. 19, 1983, also assigned to the Western Electric Company, Inc., and incorporated herein by reference.

With particular reference now to the lower terminal shank portion 14, as best seen in FIGS. 1 and 2, it is preferably of rectangular cross-section and formed with two opposite side shoulder-defining stops 14b and 14c. These stops function to control the depth of insertion of the lower shank portion 14 in the associated receiving thru-hole 26 of the circuit board 28. The offset terminal shoulders 14b and 14c, when properly located, may also optionally function as stand-offs. More specifically, they can be readily employed to control the spacing between the underside of the capacitor 20 (or any other component or component housing) and the upper adjacent side of the circuit board 28. This is often desirous, selectively, to: facilitate the cooling of certain circuit components and devices (particularly when mounted on high density boards); protect the adjacent-side printed circuitry, allow various flushing fluids to remove contaminants from the board after a soldering operation, and allow various types of protective material coatings to be applied to a given circuit board during the assembly thereof.

It should be appreciated, of course, that the terminal 10 (as well as any of the other terminal embodiments herein) could be formed with only one shoulder-defining stop, if desired, for a given application. Alternatively, the function of the shoulder-defining stops 14b and 14c could also be effected by forming preferably two laterally disposed and outwardly projecting detents or protuberances (not shown) at the proper elevation along the outer edges of the lower terminal shank portion 14. Such stops would allow the upper shank portion 14 to have any desired width and/or cross-section relative to the lower shank portion 14. Regardless of the structural nature of the depth-controlling terminal stops, the elevation thereof, as will be described in greater detail hereinbelow, is importantly chosen so as to facilitate both the temporary and reliable permanent soldered securement of the terminal within an associated thru-hole.

Considered more specifically, and in accordance with an aspect of the invention, the lower terminal shank portion 14 is formed with an upwardly extending, free-ended tab 32 that is blanked out of a central region thereof. The tab 32 is formed by a three-sided compound slot 34, comprised of two parallel and vertically oriented slot segments 34a and 34b that are interconnected by an upper horizontal slot segment 34c. As such, the compound slot 34 is essentially of inverted U-shaped configuration, with the lower end of the resulting tab being integral with the remaining lowermost end region 14a of the lower terminal shank portion 14.

The thusly formed tab 32 is significantly and importantly maintained co-planar with the major plane of the lower shank portion 14 until after the terminal has been inserted through an associated circuit board thru-hole 26 during a subsequent component assembly operation. As previously noted, this greatly facilitates the fabrication of the terminals 10 in an automated manner, while remaining part of a strip-stock carrier 36, for example, as depicted in FIG. 10. The initially in-plane oriented tab also facilitates the subsequent handling thereof both while still an integral part of the carrier and after being severed therefrom. The desired initial non-contact relationship of such a uniquely constructed terminal 10 relative to a slightly oversized plated thru-hole 26 is best seen in FIG. 2.

As illustrated in FIGS. 2 and 3, the tab 32 is dimensioned and positioned relative to the thru-hole 26, by means of the shoulder-defining stops 14b and 14c, such that the upper free end 32a thereof is positioned at an elevation that is not more than slightly above, but preferably slightly below the upper end of the thru-hole 26, i.e., below a plane defined by the upper surface of the circuit board 28, for reasons described in greater detail hereinbelow. The thusly positioned tab 32 is also dimensioned such that the lower integral end thereof is located so that a plane defined by the underside surface 28a of the circuit board passes through the tab at a point that is preferably near or at the lower end thereof. In FIGS. 2 and 3, such a plane passes approximately midway through the lower half of the tab 32. It should be appreciated, however, that this positional relationship between the lower end of the tab 32 and the thru-hole 26 is intended only to be illustrative.

The function and significance of the tab 32 formed in the terminal 10 will now be described in greater detail, relative to one preferred method of the invention, with particular reference to FIGS. 3 and 4. After each of a pair of component-attached terminals 10 has been inserted within an aligned circuit board-formed thru-hole 26 to the proper stop-controlled depth, a lowermost end region 14d of the lower terminal shank portion 14, as initially dimensioned, protrudes downwardly from the underside of the circuit board 28 by a predetermined distance. As previously noted, the shoulder-defining stops 14b and 14c are positioned to insure that the lower integral end of the tab 32 extends at least to the lower open end of an associated confining thru-hole.

Thereafter, the downwardly protruding end region 14d of the lower terminal shank portion 14 is firmly bent or clinched in a given direction, such as to the right as depicted in FIG. 3, and indicated by the direction of the arrow 38, against, or at least closely adjacent, a circuit path extension or land 39. Such a terminal clinching operation may be readily performed either manually or preferably in an automated manner with a conventional, and commercially available, composite terminal clipping and clinching apparatus, (not shown).

As a result of such a clinching operation, the upper free end 32a of the previously in-plane oriented tab 32 is pivoted in an opposite direction, i.e., to the left as viewed in FIG. 3, and indicated by the direction of the arrow 41. With the tab 32 being of rectangular configuration, the upper free end 32a thereof defines two relatively sharp corners that contact an inner plated surface 43 of the thru-hole 26, as best seen in FIG. 4. Depending on both the degree of resiliency of the rectangularly configured tab, and the bias thereof against the thru-hole sidewall, the upper free end of the pivoted tab can readily acquire a slight arcuate profile, as illustrated.

The peripheral edge at the lower end of the circuit board thru-hole 26 is thus seen to function as a fulcrum to effect the pivotal displacement of the thru-hole confined upper portion of the free-ended tab 32. Depending in part on the type of material out of which the terminal 10 is fabricated, and the dimensions thereof, the upper free end 32a of the pivoted tab may effect either a light degree of contact, or a biting type of contact, if desired, against the plated sidewall 43 of the associated thru-hole 26. In this connection, it should be appreciated that the point of tab-sidewall contact, and the ultimate orientation of the tab, may vary appreciably and still effect the desired function in accordance with the principles of the present invention. As such, the particular elevational contact point of the tab 32, and the orientation thereof depicted in FIG. 3, are only intended to be illustrative, and will obviously vary depending on the dimensions and position of the tab relative to the associated thru-hole. It is thus also appreciated, as previously noted, that the upper free end of the terminal tab in a given application could initially be positioned at an elevation having a range from only slightly above to appreciably below the upper opening of a given associated thru-hole.

In any case, the pivotal engaging tab 32 is seen to facilitate the temporary locking of the terminal 10 within an associated oversized thru-hole 26 until a permanent soldered connection is effected therebetween. As previously noted, this temporary interlocking function of the tab 32 is of particular importance when terminal-connected electrical components or devices have appreciable height and/or mass and, thus, may be readily dislodged during routine handling prior to their being simultaneously solder-secured to the circuit board 28, such as through the use of a wave-soldering machine. In this regard, the sidewall-contacting pivoted tab also advantageously allows the lowermost clinched end 14d of the terminal to be very short, even less than the diameter of a given thru-hole, if desired, and still insure that the terminal will reliably remain temporarily secured within the oversized thru-hole until a permanent soldered connection is established therebetween.

As also previously mentioned, regardless of the spring-biased force imparted by the terminal tab 32 against the thru-hole sidewall 43, any actual contact therebetween has been found to facilitate the capillary attraction of molten solder into the thru-hole from the underside thereof, particularly for an otherwise "bull's-eye" centered terminal 10. This appears to result from more effective initial bridging of molten solder between the terminal and thru-hole sidewall, and the interrelated establishment of a more effective surface tension for the solder while being drawn into the thru-hole. As such, the pivoted tab 32 also contributes to the attainment of consistent and reliable mass-produced soldered terminal connections, each of which includes the formation of a solder fillet 46 extending across the lower end of the thru-hole 26, and engaging a surrounding circuit extension or land 39, as depicted in FIG. 9.

FIG. 5 illustrates another preferred embodiment of the invention wherein a terminal 50 includes upper and lower shank portions 52 and 54, respectively, and distinguishes from the terminal 10 of FIG. 1 by having an inverted V-shaped tab 56 formed in an insertion section 54a of the lower shank portion thereof. Such a tab defines a single pointed upper free end 56a, in contrast to the two contact points defined by the opposite corners of the rectangularly shaped tab 32 in the terminal 10 of FIG. 1. As in the case with the terminal tab 32, the tab 56 is likewise pivoted during a terminal clinching operation so as to ultimately acquire the position depicted in FIG. 6, whereat it makes biased point contact against a plated sidewall 57 of an associated thru-hole 58 formed in a circuit board 59, for example.

As previously pointed out, such metal-to-metal contact advantageously facilitates not only the temporary securement of the terminal 50 within the thru-hole 59, but the attainment of a reliable soldered connection therebetween, as a result of improved capillary attraction of the molten solder into the thru-hole. In addition, with the tab 56 having a relatively sharp upper free end 56a, it is adapted to readily bite into, or at least frictionally engage, the plated thru-hole sidewall 57.

In that regard, and relative to all of the terminal embodiments disclosed herein, a biting type of tab-sidewall contact could be of particular importance, for example, should any terminal and/or thru-hole sidewall acquire any detrimental contamination, or oxide build-up, prior to a permanent soldered connection being established therebetween. In all other respects, the terminal 50 is essentially identical to the terminal 10 of FIG. 1 and, as such, also includes two shoulder-defining stops 54b and 54c formed in the lower shank portion, as well as a downwardly protruding end region 54d adapted to be clinched against the underside of the circuit board 59, as depicted in FIG. 6.

FIG. 7 illustrates a third preferred terminal embodiment wherein a terminal 60 is shown inserted in a thru-hole 62 of a circuit board 64. The terminal 60 includes upper and lower shank portions 66 and 68, respectively, with the latter including an insertion section 68a formed with two juxtaposed, free-ended tabs 72 and 74. Each tab is defined by a different one of two inverted, and oppositely directed, L-shaped slots 77 and 78 formed in the lower terminal shank portion 68. This results in the outer longitudinally disposed edge of each of tabs 72 and 74 being defined by a segment of a different outer edge of the lower shank portion 68. The lower shank portion also is formed with two opposite side shoulder-defining stops 68b and 68c, and further includes a downwardly protruding end region 68d.

The use of two (or more) pivotally displaceable tabs will depend, of course, on not only the maximum allowable width dimension of the lower shank portion 68, but on the type of material out of which the terminal is made. It is appreciated that both of these factors will have a direct bearing on the ultimate resiliency and temporary locking effectiveness of the tabs.

Those portions of the free-ended tabs 72 and 74 that are confined within the thru-hole 62, as previously described with respect to the terminals 10 and 50 of FIGS. 1 and 5, respectively, are adapted to simultaneously pivot in a direction opposite to the direction in which the protruding end region 68d of the lower terminal shank portion 68 is bent during a clinching operation. As a result, the free ends 72a and 74a of the tabs 72 and 74 are biased against an inner plated sidewall 76 of the thru-hole 62, as illustrated in FIG. 8. As previously noted, should it be desired to effect a greater degree of area contact between the free ends of the tabs 72 and 74 and the inner sidewall of a given circular thru-hole, they may be optionally formed with accurate profiles (not shown), if desired, for a particular terminal-thru-hole interconnection application. The terminal 60 in all other respects is essentially identical to the terminal 10 of FIG. 1.

In certain circuit assembly applications, miniaturized terminals may be required that could possibly allow only one longitudinally disposed slot to be formed in the lower shank portion of a given terminal to define a pivotal tab of the type of concern herein. Such a single longitudinally disposed tab-defining slot may possibly also be required in a given miniaturized terminal because of structural rigidity and/or blanking tool (or machining) limitations. In such a case, it is readily appreciated from the construction of the terminal 60, for example, that only one of the two inverted L-shaped slots 77 and 78 illustrated therein could be utilized to define a single upwardly extending free-ended tab, such as 72. It becomes readily apparent that the width of such a modified tab would simply be determined by the location of the longitudinally disposed segment of the single L-shaped slot. By way of example only, such a longitudinal slot segment could readily be located along the center line of the lower terminal shank portion 68 of the terminal 60, as indicated in phantom line form, and identified by the reference numeral 79. This would result in the previously identified tab 72, shown in solid line form, having the same width as the remaining integral and co-extensive part of the lower terminal shank portion 68.

A modified terminal formed with such a single inverted L-shaped tab-defining slot would bear a close resemblance to a terminal embodiment disclosed in a co-pending patent application, Ser. No. 490,073, filed Apr. 29, 1983, of W. J. Fanning, and assigned to the Western Electric Company, Inc. The modified version of the terminal 60 embodied herein, however, distinguishes over the prior referenced terminal by both the elevational position and size of each L-shaped slot that forms one of the free-ended tabs 72 or 74. Only when such a tab is dimensioned and positioned relative to a given thru-hole as described herein, will the tab be uniquely adapted for pivotal displacement to produce the beneficial end results described in detail hereinabove.

With respect to forming the pivotal tab (or tabs) in any of the illustrative embodiments, it should be appreciated that the necessary tab-defining compound slot (or slots) need not be formed in a single blanking (or machining) operation. For example, one or more of such slots of exceedingly narrow width could be formed in a progressive manner, by first blanking out the tab, except for the integral lower end, with the tab then acquiring an initial angular orientation relative to the remaining lower terminal shank portion. A second blanking operation could then be employed to only minutely increase the size of the opening defined by the partially blanked out tab, with the latter thereafter being bent back into the major plane of the lower terminal shank portion.

While several related and preferred electrical terminal embodiments, as well as method for the thru-hole securement of such terminals, as part of an electrical component or device, have been disclosed herein, it will be apparent that various modifications may be made to the present illustrative embodiments and method of the invention, and that a number of alternative related embodiments and methods could be devised by one skilled in the art without departing from the spirit and scope of the invention.

What is claimed is:

1. An electrical terminal of the thru-hole insertion type, which comprises:

an upper shank portion adapted for establishing an interconnection with an associated circuit element; and a lower integral shank portion including a thru-hole insertion section formed with at least one upwardly extending free-ended tab, said tab being oriented in the major plane of said lower shank portion until after insertion thereof within an associated substrate-formed thru-hole, said lower shank portion having a maximum width dimension that is less than the diameter of an associated thru-hole into which it is to be inserted, and further having stop means for positioning the upper free end of said tab at an elevation ranging from only slightly above to appreciably below the upper open end of such associated thru-hole, said tab further being dimensioned such that, when thusly positioned, the lower integral end thereof extends at least to the lower open end of the associated thru-hole, with the upper free end of said tab being adapted to be pivoted, when thusly positioned, in a first direction perpendicular to the major plane thereof, against the sidewall of the associated thru-hole in response to a then downwardly protruding end region of said lower shank portion being subsequently clinched in an opposite, second direction against the underside of the associated thru-hole-forming substrate, the upper free end of said tab, when thusly confined and ultimately pivoted, thereby facilitating not only the temporary securement of the terminal within such associated thru-hole, but the establishment thereafter of a reliable, permanent terminal-thru-hole soldered interconnection.

2. An electrical terminal in accordance with claim 1 wherein at least said lower shank portion is of thin, rectangular cross-section, and wherein at least said one initially in-plane oriented tab is of rectangular configuration, and extends longitudinally at least partially along a central region of said terminal insertion section.

3. An electrical terminal in accordance with claim 1 wherein at least said lower shank portion is of thin, rectangular cross-section, and wherein at least said one initially in-plane oriented tab is of rectangular configuration, with one longitudinally disposed edge thereof being defined by a segment of the outer edge of said lower terminal shank portion.

4. An electrical terminal in accordance with claim 3 wherein said terminal is formed out of ductile metal strip stock, with both said upper and lower shank portions thereof being of rectangular cross-section, and wherein said tab is defined by an inverted L-shaped slot formed in said lower terminal shank portion.

5. An electrical terminal in accordance with claim 1 wherein at least said lower shank portion is of thin, rectangular cross-section, and wherein at least two juxtaposed, upwardly extending and initially in-plane oriented tabs are formed in said terminal insertion section.

6. A terminal in accordance with claim 5 wherein said terminal is formed out of ductile metal strip stock, with both said upper and lower shank portions thereof being of rectangular cross-section, and wherein said in-plane oriented tabs are parallel, of rectangular configuration, and each having one longitudinally disposed edge defined by a segment of a different outer edge of said lower terminal shank portion, with the upper free end of each tab, and the inner longitudinal edge thereof, being defined by an inverted L-shaped slot formed in said lower terminal shank portion.

7. An electrical terminal in accordance with claim 5 wherein said stop means formed in said lower shank portion comprises two opposite side, cut-back shoulders, and wherein said upper shank portion is offset from the lower shank portion by an interconnecting, laterally disposed, shoulder-defining leg portion.

8. An electrical terminal in accordance with claim 1 wherein at least said lower shank portion is of thin, rectangular cross-section, and wherein at least said one initially in-plane oriented tab is of inverted V-shaped configuration, and extends longitudinally at least partially along a central region of said terminal insertion section.

9. An electrical terminal in accordance with claim 1 wherein said upper shank portion is offset from said lower shank portion by an interconnecting, laterally disposed, shoulder-defining leg portion.

10. A component module, comprising:
a component having first and second spaced electrodes, and
first and second electrical terminals, each including an upper shank portion secured to a different one of said first and second electrodes, each of said first and second terminals further including a lower integral shank portion having a thru-hole insertion section formed with at least one upwardly extending free-ended tab, said tab being oriented in the major plane of said lower shank portion until after insertion thereof within an associated substrate-formed thru-hole, said lower shank portion having a maximum width dimension that is less than the diameter of an associated thru-hole into which it is to be inserted, and further having stop means for positioning the upper free end of said tab at an elevation ranging from only slightly above to appreciably below the upper open end of such associated thru-hole, said tab further being dimensioned such that, when thusly positioned, the lower integral end thereof extends at least to the lower open end of the associated thru-hole, with the upper free end of said tab being adapted to be pivoted, when thusly positioned, in a first direction perpendicular to the major plane thereof, against the sidewall of the associated thru-hole in response to a then downwardly protruding end region of said lower shank portion being subsequently clinched in an opposite, second direction against the underside of the associated thru-hole-forming substrate, the upper free end of said tab, when thusly confined and ultimately pivoted, thereby facilitating not only the temporary securement of the terminal within such associated thru-hole. but the establishment thereafter of a reliable, permanent terminal-thru-hole soldered interconnection.

11. A component module in accordance with claim 10 wherein each of said first and second terminals is formed out of ductile metal strip-stock, wherein both said upper and lower shank portions thereof are of rectangular cross-section, and wherein said stop means formed in said lower terminal shank portion comprises two opposite side cut-back shoulders formed therein.

12. A component module in accordance with claim 11 wherein said component comprises a metallized film-wound capacitor having two solder block type end electrodes, and wherein said upper terminal shank portion is offset from said lower shank portion by an interconnecting, laterally disposed, shoulder-defining leg portion.

13. A component module in accordance with claim 10 wherein at least said one initially in-plane oriented tab is of rectangular configuration, and extends longitudinally at least partially along a central region of said terminal insertion section.

14. A component module in accordance with claim 10 wherein at least said one initially in-plane oriented tab is of rectangular configuration, with one laterally disposed edge thereof being defined by a segment of an outer edge of said lower terminal shank portion.

15. A component module in accordance with claim 14 wherein said tab is defined by an inverted L-shaped slot formed in said lower terminal shank portion.

16. A component module in accordance with claim 10 wherein at least two juxtaposed, upwardly extending and initially in-plane oriented tabs, of rectangular configuration, are formed in said lower terminal shank portion, with each of said tabs having one longitudinally disposed edge defined by a segment of a different outer edge of said lower terminal shank portion, with the upper free end of each tab, and the inner longitudinal edge thereof being defined by an inverted L-shaped slot formed in said lower terminal shank portion.

17. A component module in accordance with claim 10 wherein at least said one initially in-plane oriented tab is of inverted V-shaped configuration, and extends longitudinally at least partially along a central region of said terminal insertion section.

18. A method of temporarily securing an insertion section of an electrical terminal having upper and lower shank portions, the latter including an insertion section, within an associated thru-hole formed in a supporting substrate and, thereafter, facilitating the establishment of a reliable, permanent soldered connection therebetween, said method comprising the steps of:
forming at least one upwardly extending free-ended tab in the lower shank portion of said terminal, said tab as formed being oriented in the major plane of said lower shank portion until after the insertion thereof within an associated substrate formed thru-hole, said lower shank portion also being formed with a maximum width dimension that is less than the diameter of an associated thru-hole into which it is to be inserted;

forming stop means in said lower terminal shank portion for positioning the upper free end of said tab at an elevation ranging from only slightly above to appreciably below the upper open end of such associated thru-hole, said tab further being dimensioned such that, when thusly positioned, the lower integral end thereof extends at least to the lower open end of the associated thru-hole;

inserting the lower shank portion of said terminal within an associated substrate-formed thru-hole to the predetermined, stop-controlled depth, said terminal as thus inserted resulting in a lowermost end region of said lower terminal shank portion protruding a predetermined distance downwardly beyond the underside of said supporting substrate; and bending the downwardly protruding end region of said lower terminal shank portion in a first direction, perpendicular to the major plane thereof, to clinch the protruding terminal end region against the underside of the supporting substrate, said bending and clinching step simultaneously resulting in said initially in-plane oriented tab, as then confined with said thru-hole, being pivoted in a second direction, opposite to said first terminal bending direction, such that the free end of said tab is biased against the associated thru-hole sidewall, said pivoted tab, thereby, not only facilitating the temporary securement of the terminal within the associated thru-hole, but the establishment thereafter of a reliable, permanent terminal-thru-hole soldered interconnection.

19. A method in accordance with claim 18 wherein said terminal is formed out of sheet stock to have a thin, rectangular cross-section, and wherein during said tab-forming step, the upper free end of at least said one upwardly extending and pivotal tab is formed with at least one relatively sharp region adapted to frictionally contact a conductive sidewall of the associated thru-hole, and wherein said method further includes the step of forming a laterally disposed, shoulder-defining region interposed between said upper and lower terminal shank portions and resulting in a predetermined offset therebetween.

20. A method in accordance with claim 19 further including the step of securing the upper shank portion of each of first and second ones of said formed terminals to a different one of first and second spaced electrodes of an electrical component, prior to said terminal insertion step.

* * * * *